(12) United States Patent
Kollar

(10) Patent No.: US 12,088,427 B2
(45) Date of Patent: *Sep. 10, 2024

(54) SYSTEM AND METHOD OF OPERATING A SYSTEM

(71) Applicant: SEW-EURODRIVE GMBH & CO. KG, Bruchsal (DE)

(72) Inventor: Hans Jürgen Kollar, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,477

(22) Filed: Aug. 22, 2023

(65) Prior Publication Data

US 2023/0396463 A1    Dec. 7, 2023

Related U.S. Application Data

(63) Continuation of application No. 17/763,442, filed as application No. PCT/EP2020/025402 on Sep. 9, 2020, now Pat. No. 11,743,072.

(30) Foreign Application Priority Data

Oct. 2, 2019 (DE) .......................... 102019006875.0

(51) Int. Cl.
*H04L 12/40* (2006.01)
*H03K 19/17784* (2020.01)
(52) U.S. Cl.
CPC . *H04L 12/40013* (2013.01); *H03K 19/17784* (2013.01); *H04L 12/40039* (2013.01); *H04L 2012/40215* (2013.01)
(58) Field of Classification Search
CPC ......... H04L 2012/402; H04L 12/40039; H04L 12/0013
See application file for complete search history.

(56) References Cited

U.S. PATENT DOCUMENTS 7,328,286 B2    2/2008    Vinnemann
7,590,140 B2    9/2009    Hartzsch
(Continued)

FOREIGN PATENT DOCUMENTS

DE          10261174 B3    6/2004
DE      102018104873 A1    9/2019
(Continued)

OTHER PUBLICATIONS

International Search Report issued in corresponding International Application No. PCT/EP2020/025402 dated Nov. 30, 2020, pp. 1-2, English Translation.
(Continued)

*Primary Examiner* — Henry Tsai
*Assistant Examiner* — Christopher A Daley
(74) *Attorney, Agent, or Firm* — Carter, DeLuca & Farrell LLP

(57) ABSTRACT

In a system and method of operating a system that includes a controller and a first bus participant and a successor, the bus participant and successor each has a circuit arrangement arranged between an output and an input, a first resistor is arranged between the output and the supply voltage terminal, a second resistor is arranged between the input and a ground terminal, a third resistor can be arranged between the input and the supply voltage terminal by a first controllable semiconductor switch, and a fourth resistor can be arranged between the output and the supply voltage terminal by a second controllable semiconductor switch.

22 Claims, 3 Drawing Sheets

(56) References Cited

U.S. PATENT DOCUMENTS

| | | | |
|---|---|---|---|
| 8,395,127 B1 * | 3/2013 | Frach | G01T 1/20184 |
| | | | 250/370.11 |
| 8,856,413 B2 | 10/2014 | Schultz | |
| 10,361,996 B2 * | 7/2019 | Schmitz | H04L 12/40045 |
| 10,367,762 B2 * | 7/2019 | Klose | H04L 41/24 |
| 10,367,782 B2 | 7/2019 | Schmitz | |
| 10,715,350 B2 | 7/2020 | Gang | |
| 10,795,845 B1 * | 10/2020 | Vemuri | H04L 12/40019 |
| 11,424,952 B2 * | 8/2022 | Vandersteegen | |
| | | | H04L 12/40006 |
| 2003/0057779 A1 * | 3/2003 | Reichard | H02J 1/10 |
| | | | 307/147 |
| 2008/0198636 A1 * | 8/2008 | Yang | H02M 3/1584 |
| | | | 363/41 |
| 2009/0146610 A1 * | 6/2009 | Trigiani | H02J 7/00302 |
| | | | 320/119 |
| 2010/0274945 A1 | 10/2010 | Westrick, Jr. et al. | |
| 2012/0284441 A1 * | 11/2012 | Landman | G06F 13/4295 |
| | | | 710/110 |
| 2013/0187610 A1 * | 7/2013 | Hayashi | H02J 7/00 |
| | | | 320/118 |
| 2016/0254925 A1 | 9/2016 | Ulrich | |
| 2017/0222275 A1 | 8/2017 | Krishnan | |

FOREIGN PATENT DOCUMENTS

| | | |
|---|---|---|
| EP | 2154831 A1 | 2/2010 |
| EP | 2232829 B1 | 10/2012 |

OTHER PUBLICATIONS

International Report on Patentability issued in corresponding International Application No. PCT/EP2020/025402 dated Apr. 5, 2022, pp. 1-7, English Translation.

* cited by examiner

SYSTEM AND METHOD OF OPERATING A SYSTEM

CROSS-REFERENCE TO RELATED APPLICATIONS

The present application is a continuation of U.S. patent application Ser. No. 17/763,442, which is the national stage of PCT/EP2020/025402, having an international filing date of Sep. 9, 2020, and claims priority to Application No. 102019006875.0, filed in the Federal Republic of Germany on Oct. 2, 2019, each of which is expressly incorporated herein in its entirety by reference thereto.

FIELD OF THE INVENTION

The present invention relates to a system and a method for its operation.

BACKGROUND INFORMATION

A self-initializing interface is described in European Patent Document No. 2 232 829.

German Patent Document No. 10 2018 104 873 describes an auto-addressing method for assigning bus participant addresses within a data bus system with a communication bus including bus participants and a bus master.

U.S. Patent Application Publication No. 2016/0254925 describes how to set a bus participant address and, if necessary, the bus participant termination of a bus participant based on the bus wiring via an initialization phase.

U.S. Patent Application Publication No. 2010/0274945 describes a system for addressing nodes in a multi-drop wired network.

SUMMARY

Example embodiments of the present invention provide for further improving address assignments in a bus system.

In the present context, ground refers to the reference potential, i.e., the lower potential of the supply voltage, which is in the form of DC voltage.

According to an example embodiment of the present invention, a system includes a controller and at least a first bus participant and a successor, i.e., second bus participant. The controller is connected, e.g., serially, to the first bus participant by a data bus, e.g., a CAN bus, RS485 bus, etc., and the successor is connectable. Each bus participant, e.g., the first bus participant, in each case has a first circuit arrangement between an output OUT of the first bus participant and an input IN of the first bus participant. The successor includes a second circuit arrangement between an output OUT of the successor and an input IN of the successor, and the first and second circuit arrangements are of an identical and/or similar configuration. The first and second circuit arrangements have a supply voltage connection, and the first circuit arrangement includes a device for detecting the voltage applied to the output OUT, e.g., to ground. A first resistor R4 is arranged between the output OUT and the supply voltage terminal, and a second resistor R2 is arranged between the input IN and a ground terminal. By a first controllable semiconductor switch, a third resistor R1 may be arranged between the input IN and the supply voltage terminal, e.g., such that the third resistor R1 is arranged in parallel to the first resistor R4, when the successor is connected to the first bus participant, and by a second controllable semiconductor switch, a fourth resistor R3 may be arranged between the output OUT and the supply voltage terminal, e.g., such that the fourth resistor R3 is arranged in parallel with the third resistor R1, when connecting the successor to the first bus participant.

Depending on the activation state of the semiconductor switches and depending on the connection state of the first bus participant with the successor, it is considered advantageous that the voltage at the output of the first bus participant can be produced. Thus, the connection of the successor to the first bus participant is noticeable by the latter by detecting the corresponding voltage at the output OUT of the first bus participant. In addition, the detected voltage value may be used to determine whether or not the successor is supplied with a supply voltage. Furthermore, it can be determined whether the input of the successor is activated or not, e.g., whether or not the first controllable semiconductor switch of the successor is in the conductive state.

Thus, the request for the assignment of a bus address can also be detected and forwarded by the first bus participant via the data bus, in that the successor has yet to be assigned an address. If, therefore, the successor is properly connected, i.e., supplied with a supply voltage, to the first bus participant and activates its input, a request for assignment of an address is sent from the first bus participant to the controller via the data bus. Furthermore, this data bus is serially looped from the controller via the first bus participant through to the newly connected successor; however, the output and the input are provided separately from the data bus. The system described herein thus requires a connecting line in addition to the data bus between the first bus participant and the successor, e.g., between the output of the first bus participant and the input of the successor.

Thus, a self-initializing interface is obtained, in that a bus address is automatically assigned to a bus participant, when adding the next bus participant.

For example, the bus participants, e.g., the successor, are each arranged as inverters.

According to example embodiments, the input IN of the successor can be connected to the output OUT of the first bus participant. It is considered advantageous that the successor may be connected to the first bus participant, such that an electrical connection is provided from the output OUT of the first bus participant to the input IN of the successor.

According to example embodiments, the successor includes a device for detecting the voltage applied to the input IN of the successor, e.g., to ground. For example, the successor includes a device for detecting the voltage applied to the output OUT of the successor, e.g., to ground. It is considered advantageous that the successor can detect whether or not its input is connected to the output OUT of the first bus participant. As soon as it has detected this connection, it activates its input IN and thus provides for the request for a new bus address to be sent, and this request is issued by the first bus participant.

According to example embodiments, the first bus participant has a device for detecting the voltage applied to the input IN of the first bus participant, e.g., to ground. The advantage is that the first bus participant may act in the same manner, when connecting it on the input side to a predecessor, such as the controller or another bus participant, as the successor, when connecting it to the first bus participant.

According to example embodiments, the successor and/or the first bus participant has arranged at its input IN a first protection circuit against excessively low and/or excessively high voltages, and a second protection circuit against excessively low and/or excessively high voltages is arranged at the output OUT. The advantage is that protection against overvoltage and excessively low voltage can be provided.

According to example embodiments, a first capacitor is arranged between the input IN and ground, and a second capacitor is arranged between the output OUT and ground. The advantage is that the respective voltages are smoothed and/or a short circuit realized for high frequency.

According to example embodiments, the first protection circuit includes a resistor R6 arranged between the input IN and a first diode, and the first diode is arranged between the resistor R6 and the supply voltage terminal, such that current is supplied to the supply voltage terminal through the first diode, when a voltage higher than the supply voltage is applied to the input IN. For example, a second diode is arranged between the resistor R6 and ground, such that current is supplied to ground through the second diode, when a negative voltage is applied to the input IN. The advantage is that the protection circuit may be obtained in a simple manner.

According to example embodiments, the second protection circuit includes a resistor R7 arranged between the output OUT and a third diode, and the third diode is arranged between the resistor R7 and the supply voltage terminal, such that current is supplied to the supply voltage terminal through the third diode, when a voltage higher than the supply voltage is applied to the output OUT. For example, a fourth diode is arranged between the resistor R7 and ground, such that current is supplied to ground through the fourth diode, when a negative voltage is applied to the output OUT. The advantage is that the protection circuit may be achieved in a simple manner.

According to example embodiments, the first and second controllable semiconductor switches of the first circuit arrangement are arranged in an integrated manner in a first component. The advantage is that cost-effective production may be achieved by SMD assembly. The circuit may thus be achieved in a simple manner.

According to example embodiments, the first, second, third, and fourth diode of the first circuit arrangement are integrally arranged in a second component. The advantage is that cost-effective, simple assembly may be achieved. By reducing the number of components, which is achievable in this manner, simple cost-effective production and a robust end product may be achieved.

According to example embodiments, the first circuit arrangement has a printed circuit board upon which the first and second components are fitted, e.g., by using SMD technology. The advantage is that the component may be configured robustly and thus the number of components reduced.

According to an example embodiment of the present invention, in a method for operating a system having a controller and at least a first bus participant and a successor, i.e., a second bus participant, the controller is connected, e.g., serially, to the first bus participant by a data bus, e.g., a CAN bus, RS485 bus, etc., and the successor is connectable, each bus participant, e.g., the first bus participant, has an activatable output and an activatable input, the successor also has an activatable output and an activatable input, each output has a first or second resistance value to a supply voltage terminal depending on its activation, each input, depending on its activation, has a third or fourth resistance value, e.g., from the output to the electrical ground, e.g., a zero potential or ground, toward the successor, the voltage present at the output of the first bus participant is detected and recognized depending on the detected voltage, while taking into account the activation state of the output of the first bus participant, whether no successor is connected to the first bus participant, i.e., for example, whether the output is open, whether a successor with no supply voltage is connected to the first bus participant, whether a successor, which is supplied with a supply voltage and whose input is activated, is connected to the first bus participant, whether a successor, which is supplied with a supply voltage and whose input is not activated, is connected to the first bus participant, and whether a terminating plug is connected to the first bus participant, i.e., for example, whether the output is electrically connected to ground.

It is considered advantageous that first the voltage at the output is detected and subsequently the voltage range, in which this voltage falls, is determined. Depending on the detected and/or determined voltage range, further action is initiated according to the associated information. For example, when the termination plug is detected, initial configuration is completed and regular operation resumed. When a successor is detected, an address assignment is initiated, then waiting for the activation of the successor's input, i.e., the acknowledgement of receipt of the new address by the successor. Even though each bus participant, i.e., for example, the first bus participant and the successor, must be connected to the data bus, carrying out the method requires only one signal line, which connects the respective output of a preceding bus participant to the input of a succeeding bus participant, e.g., a successor.

By activating or deactivating the second controllable semiconductor switch of the first bus participant, various information may be encoded, for the successor to decode. Likewise, by activating or deactivating the first controllable switch, i.e., the input, of the successor, information for the first bus participant can be encoded.

According to example embodiments, it is decided whether the detected voltage is included in a first, second, third, or fourth voltage range, the first voltage range is above the second voltage range, the second voltage range is above the third voltage range, and the third voltage range is above the fourth voltage range. The first voltage range encodes the information that no successor is connected to the first bus participant, i.e., for example, that the output is open, the third voltage range encodes the information that a successor, which has no supply voltage, is connected to the first bus participant, a further voltage range encodes the information that a successor is connected to the first bus participant, which successor is supplied with a supply voltage, and whose input is activated, the second voltage range encodes the information that a successor is connected to the first bus participant, which successor is supplied with a supply voltage, and whose input is not activated, and the fourth voltage range encodes the information that a termination plug is connected to the first bus participant, i.e., for example, the output is electrically connected to ground.

It is considered advantageous that after detecting the voltage at the output of the first bus participant, the voltage range in which the detected voltage value is contained is determined. Since each of the voltage ranges has correspondingly assigned information, further action may be carried out according to this information. For example, if it is determined that the successor is connected but not supplied, an error message can be displayed. However, if the successor is connected and supplied, whereby its input is not activated, the first bus participant requests a bus address for its successor, whereby the controller acts as the bus master and subsequently transmits the address via the data bus, such that upon receipt of this bus address, the successor accepts this address and acknowledges its acceptance by activating its input. Thus, the first bus participant does not have to re-request the bus address for the successor or continue to request it.

To further increase the reliability of determining the state of the successor, the voltage at the output of the first bus participant is measured, when the output is deactivated, including when the output of the first bus participant is activated. Thus, the state of the successor can be determined with maximum reliability.

According to example embodiments, depending on the detected voltage and the activation state of the output of the first bus participant, the following takes place: a respective state, e.g., an error state, is signaled by the first bus participant or the assignment of an address is requested, e.g., the receipt of the address, e.g., from the successor, is acknowledged. It is considered advantageous that the controller is also informed about the state of the successor, such that actions depending thereon can also be triggered by the first bus participant.

Further features and aspects of example embodiments of the present invention are explained in more detail with reference to the appended schematic Figures.

DETAILED DESCRIPTION

Figure 1:
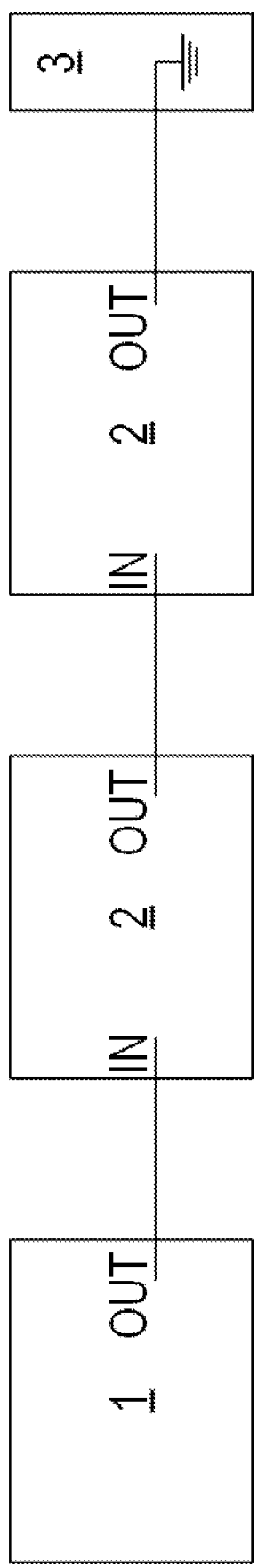
FIG. 1 schematically illustrates a bus system including a controller 1 and serially arranged bus participants 2, e.g., inverters, and a terminating plug.
Figure 2:
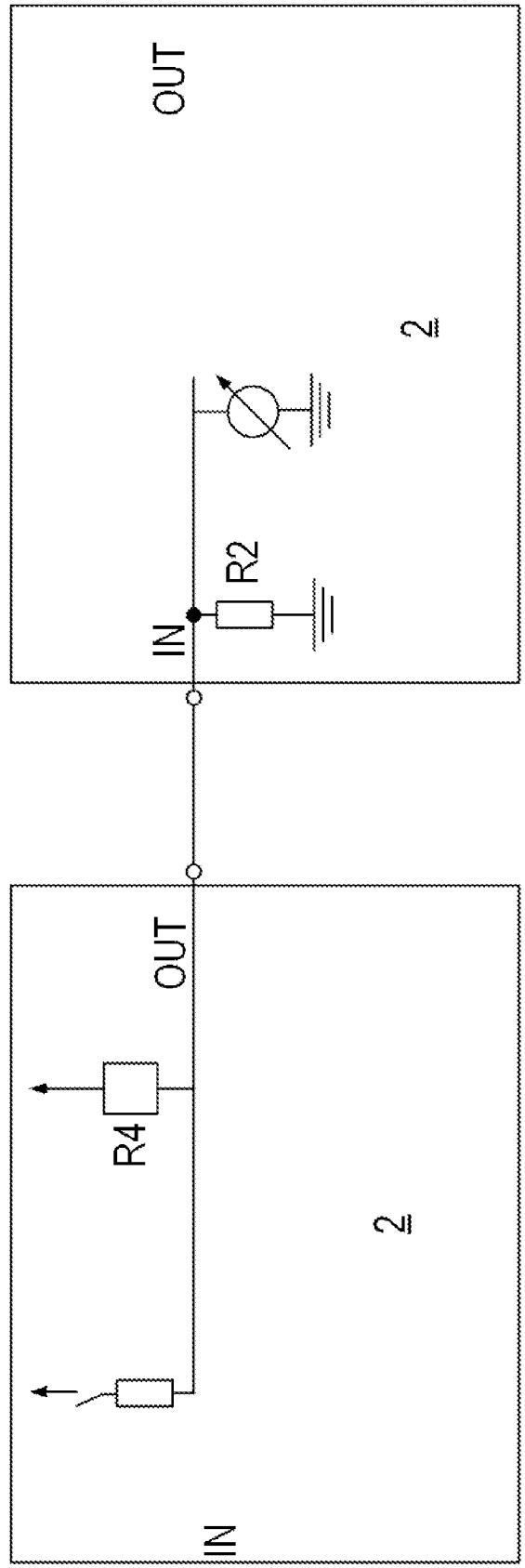
FIG. 2 schematically illustrates two bus participants 2, in which the output OUT of a first bus participant 2 is connected to the input IN of a second bus participant 2.
Figure 3:
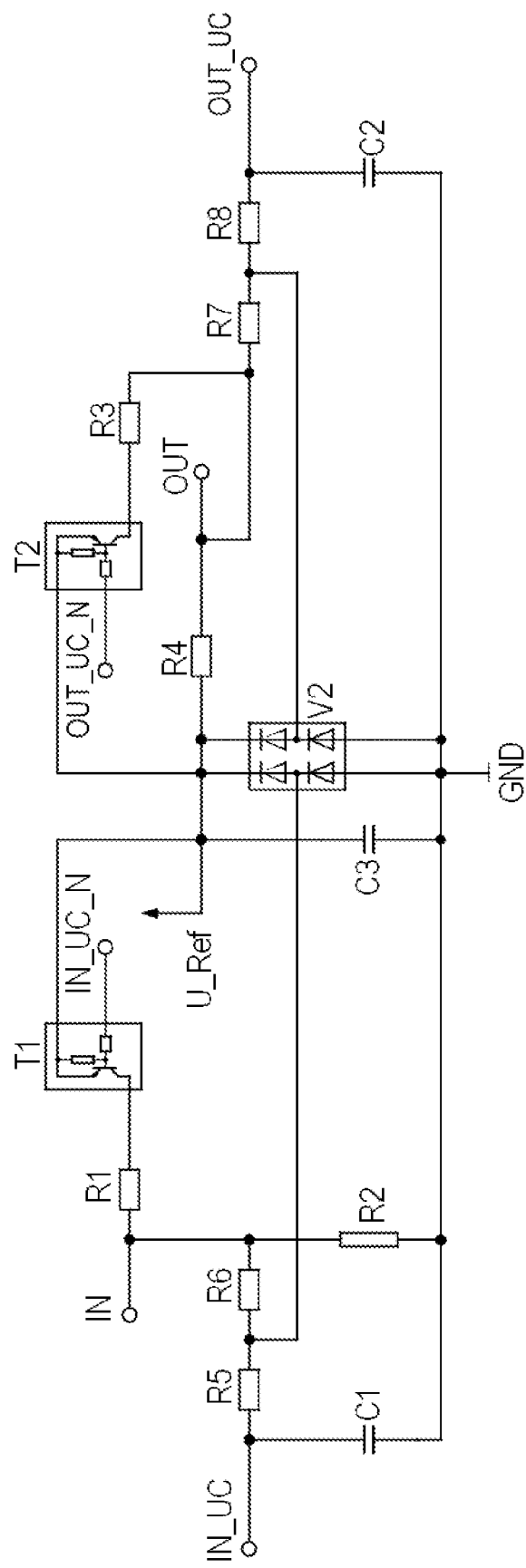
FIG. 3 schematically illustrates a circuit arrangement between the input IN and the output OUT in a bus participant 2.

As schematically illustrated in FIGS. 1 to 3, an output OUT of the controller 1 is connected to an input IN of a first of the bus participants 2, which in turn is connected to another bus participant 2. A terminating plug 3 is connected directly to its output OUT or one or more bus participants 2 provided in series, and the terminating plug 3 is connected to the last of the bus participants.

Each bus participant 2 has a circuit arrangement between its input IN and its output OUT.

As shown in FIG. 2, this circuit arrangement has a resistor R4 arranged between the output OUT of the bus participant 2 and a terminal carrying an upper potential of a supply voltage U_REF. This upper potential is only present if a corresponding supply voltage source is present.

In addition, this circuit arrangement has a resistor R2, which is arranged between the input IN of the bus participant 2 and ground, e.g., a terminal carrying a lower potential of a supply voltage U_REF.

The two resistors R2 and R4 are, for example, selected to be of equal size.

Moreover, the circuit arrangement has a voltage sensing device, which senses the voltage applied to the resistor R2. If no voltage supply is present, the voltage sensing device has the input resistor of the voltage sensing device connected in parallel with resistor R2, such that the voltage divider formed by resistor R4 and resistor R2 together with the input resistor steps down the voltage further, than when the input resistor is absent.

The voltage detection device detects the voltage applied to IN_UC.

An input protection circuit is formed by a capacitor C1, a resistor R5, a resistor R6, and a diode bridge device V2. For this purpose, the capacitor C1 is arranged between the input of the voltage sensing device and ground, such that a short circuit for high frequency is formed and the voltage to be measured smoothed.

The diode bridge arrangement V2 has two series circuits connected in parallel with one another, and each of the series circuits has two diodes connected in series. The series circuits are powered by the supply voltage, and the diodes are arranged in the reverse direction, when the upper potential is above ground.

The output OUT is connected to the junction node of the two diodes of the first series circuit via the resistor R5. Between this connection node and ground, a series circuit is formed by the two resistors R6 and R2.

The input IN is connected to the connection node, to which the two resistors R6 and R2 are connected.

An output protection circuit is formed by a capacitor C2, a resistor R7, a resistor R8, and the diode bridge device V2, e.g., the second series circuit of the diode bridge device V2. For this purpose, the capacitor C2 is arranged between the input of the voltage sensing device and ground, such that a short circuit for high frequency is formed and the voltage to be measured smoothed.

The output OUT is connected to the junction node of the two diodes of the first series circuit via the resistor R7. Resistor R8 is located between this connection node and the second capacitor C2. The output OUT is connected to the supply voltage via the resistor R4.

By controlling a second controllable semiconductor switch T2, e.g., a transistor, the output OUT is connected to the supply voltage via the resistor R3. Since the resistor R3 is connected in parallel with the resistor R4, the effective resistance between the output OUT and the supply voltage is, in each case, halved for the same dimensioning. When connecting the subsequent bus subscriber 2, i.e., the output OUT with the input IN of the subsequent bus subscriber 2, the voltage divider formed by the series connection of the parallel circuit formed by the resistors R3 and R4 with the resistor R2 of the subsequent bus subscriber 2 steps down the supply voltage to two thirds of the supply voltage.

If the terminating plug 3 is connected to the output OUT, i.e., the output OUT is directly electrically connected to ground, a voltage of 0 volts, or at least close to 0 volts, is detected. Thus, the terminating plug 3 can be identified. However, if no subsequent bus participant 2 is connected to the output OUT and the output OUT is therefore open, the bus participant 2 can transmit this information to its predecessor by connecting the input IN to the supply voltage via the resistor R1 by controlling a first controllable semiconductor switch T1, e.g., a transistor. Thus, the voltage divider formed with the resistor R4 of the predecessor results in a stepped-down voltage at input IN of two-thirds of the supply voltage, when the predecessor has yet to activate its second transistor T2. However, its second transistor T2 has been activated, a stepdown to three quarters of the supply voltage occurs due to the voltage divider. This is because the voltage divider is formed from a series circuit, and the resistor R2 of the bus subscriber is connected in series with the parallel circuit, which has the resistors R1 of the bus subscriber and the resistors R3 and R4 of the predecessor.

Thus, by controlling the first controllable semiconductor switch T1 of the predecessor of a bus participant 2, an address assignment to the bus participant 2 may be initiated.

By activating the second controllable semiconductor switch T2 of the bus participant 2 and then connecting the successor to the bus participant 2, whereby the first controllable semiconductor switch T1 of the successor is activated, three quarters of the supply voltage at the output OUT of the bus participant 2 can therefore be produced. When the first controllable semiconductor switch T1 of the successor is not activated, two thirds of the supply voltage can be produced at the output OUT. This allows for the connection of the successor to the bus participant 2 to be identified. Since the bus participants 2 are connected to one another by a data link, which leads to the controller 1, it is possible to determine whether a successor has been additionally connected, whereupon the controller 1 assigns an address, i.e., a bus address, to the successor as the new additional bus participant 2.

The control of the first controllable semiconductor T1 can be implemented at the output IN_UC_N, and the control of the second controllable semiconductor switch T2 can be implemented at the output OUT_UC_N.

If the resistors R1, R2, R3, R4, R6, R7 are of the same values, the following behavior results:

If no successor is connected to bus participant 2, the full supply voltage can be detected at the output OUT of bus participant 2, i.e., a voltage of a first voltage value range.

If a successor is connected to bus participant 2 and supplied with a supply voltage, two thirds of the supply voltage can be detected at the output OUT of bus participant 2, i.e., a voltage of a second voltage value range. The controllable semiconductor switches T1 and T2 are not controlled.

If a successor is connected to bus participant 2, but not supplied with a supply voltage, then half the supply voltage is detectable at the output OUT of bus participant 2, i.e., a voltage of a third voltage value range.

If a successor is connected to bus participant 2 and provided with a supply voltage, then two thirds of the supply voltage can be detected at the output OUT of bus participant 2 by controlling the second controllable semiconductor switch T2 of the bus participant, i.e., a voltage of a second voltage value range, when semiconductor switch T2 is activated, i.e., when it is set to the conductive state. When detecting this voltage, the successor is ready to receive, and awaits the address sent by the controller 1, e.g., as a broadcast. In this manner, the successor is assigned its address, i.e., its bus address.

If a vanishingly small voltage, e.g., zero, is detectable at the output of bus participant 2, a terminating plug 3 has been detected. The vanishingly small voltage is therefore of a fourth range of voltage values.

In addition, it is possible for the successor to activate its first controllable semiconductor switch T1 and thus generate at its input IN, i.e., also at the output OUT of the bus subscriber, two thirds of the supply voltage, i.e., a voltage of the second voltage range, if the second controllable semiconductor switch T2 of the bus participant has yet to be activated, or three quarters of the supply voltage, i.e., a voltage, which is between the second voltage range and the first voltage range, if the second controllable semiconductor switch T2 of the bus participant has been activated.

The first voltage range is above the second voltage range.
The second voltage range is above the third voltage range.
The third voltage range is above the fourth voltage range.

If the resistors R1, R2, R3, R4, R6, R7 are of the same values, different voltage values result, whereby only the arrangement and the voltage range are relevant for the functioning of the system described herein.

The four diodes V2 of the circuit arrangement are, for example, arranged, such that they can be integrated in a common component. Likewise, the first and second controllable semiconductor switches are arranged in an integrated manner in a common component. Therefore, the circuit arrangement may be achieved by a printed circuit board, which is equipped with the two components and the resistors, especially by using SMD technology. Additionally, the resistors are also integrated in a common third component, such that the circuit arrangement can be produced in a very compact fashion.

LIST OF REFERENCE CHARACTERS

1 Control
2 Bus participants, e.g., inverters
3 Termination plug
R1 Third resistor
R2 Second resistor
R3 Fourth resistor
R4 First resistor
R5 Resistance
R6 Resistor
C1 Capacitor
C2 Capacitor
C3 Capacitor
T1 First controllable switch
T2 Second controllable switch
IN Input
OUT Output
IN_UC control input
OUT_UC control input
U_Ref supply voltage

What is claimed is:

1. A system, comprising:
    at least one bus participant, each bus participant including:
        an input;
        an output;
        a ground terminal; and
        electronic circuitry arranged between the input and the output and including:
            a supply voltage terminal;
            a first resistor arranged between the supply voltage terminal and the output;
            a second resistor arranged between the input and the ground terminal;
            a third resistor;
            a first controllable semiconductor switch adapted to selectively connect the third resistor between the input and the supply voltage terminal;
            a fourth resistor; and
            a second controllable semiconductor switch adapted to selectively connect the fourth resistor between the output and the supply voltage terminal.

2. The system according to claim 1, wherein the output of a first one of the bus participants is adapted to connect to an input of a second one of the bus participants.

3. The system according to claim 1, further comprising a controller including an output connected to the input of a first one of the bus participants.

4. The system according to claim 1, further comprising a controller and a termination plug;
    wherein the at least one bus participant includes a plurality of bus participants connected in series, the input of a first one of the series-connected bus participants connected to an output of the controller, the output of a last one of the series-connected bus participants connected to the termination plug.

5. The system according to claim 4, wherein the output of each bus participant between the controller and the last one of the series-connected bus participants is connected to an input of a subsequent one of the bus participants.

6. The system according to claim 1, wherein the first controllable semiconductor switch is adapted to connect the third resistor between the input and the supply voltage terminal to arrange the third resistor in parallel with the first resistor.

7. The system according to claim 1, wherein the second controllable semiconductor switch is adapted to selectively connect the fourth resistor between the output and the supply voltage terminal to arrange the fourth resistor in parallel with the third resistor.

8. The system according to claim 6, wherein the second controllable semiconductor switch is adapted to selectively connect the fourth resistor between the output and the supply voltage terminal to arrange the fourth resistor in parallel with the third resistor.

9. The system according to claim 1, wherein at least one of the bus participants includes voltage sensor circuitry adapted to sense a voltage applied to the output.

10. The system according to claim 1, wherein at least one of the bus participants includes voltage sensor circuitry adapted to sense a voltage applied to the input.

11. The system according to claim 1, wherein at least one of the bus participants includes first protection circuitry connected to the input and adapted to protect against over- and/or under-voltages.

12. The system according to claim 1, wherein at least one of the bus participants includes protection circuitry connected to the output and adapted to protect against over- and/or under-voltages.

13. The system according to claim 11, wherein at least one of the bus participants includes second protection circuitry connected to the output and adapted to protect against over- and/or under-voltages.

14. The system according to claim 1, wherein a first capacitor is connected between the input and ground and a second capacitor is connected between the output and ground.

15. The system according to claim 11, wherein the first protection circuitry includes a fifth resistor arranged between the input and a first diode, the first diode being connected between the fifth resistor and the supply voltage terminal.

16. The system according to claim 15, wherein a second diode is arranged between the fifth resistor and ground.

17. The system according to claim 12, wherein the protection circuitry includes a fifth resistor connected between the output and a first diode, the first diode being connected between the fifth resistor and the supply voltage terminal.

18. The system according to claim 17, wherein a second diode is connected between the fifth resistor and ground.

19. The system according to claim 1, wherein the first controllable semiconductor switch and the second controllable semiconductor switch are integrated in a first component.

20. The system according to claim 19, wherein the electronic circuitry includes a printed circuit board, the component being arranged on the printed circuit board.

21. The system according to claim 1, wherein the electronic circuitry includes four resistors, including the first resistor, the second resistor, the third resistor, and the fourth resistor.

22. A system, comprising:
at least one bus participant, each bus participant including:
an input;
an output;
a ground terminal; and
electronic circuitry arranged between the input and the output and including:
four resistors;
a supply voltage terminal;
a first one of the four resistors arranged between the supply voltage terminal and the output;
a second one of the four resistors arranged between the input and the ground terminal;
a first controllable semiconductor switch adapted to selectively connect a third one of the four resistors between the input and the supply voltage terminal; and
a second controllable semiconductor switch adapted to selectively connect a fourth one of the four resistors between the output and the supply voltage terminal.

* * * * *